(12) United States Patent
Persoon et al.

(10) Patent No.: US 8,598,524 B2
(45) Date of Patent: *Dec. 3, 2013

(54) SLIDER BEARING FOR USE WITH AN APPARATUS COMPRISING A VACUUM CHAMBER

(75) Inventors: Johannes Antonius Hendricus Wilhelmus Gerardus Persoon, Waalre (NL); Andreas Theodorus Engelen, Eindhoven (NL); Siegfried Lichtenegger, Eindhoven (NL); Petrus Henricus Joannes Van Dooren, Eindhoven (NL)

(73) Assignee: FEI Company, Hillsboro, OR (US)

( * ) Notice: Subject to any disclaimer, the term of this patent is extended or adjusted under 35 U.S.C. 154(b) by 441 days.

This patent is subject to a terminal disclaimer.

(21) Appl. No.: 12/303,715

(22) PCT Filed: Apr. 26, 2007

(86) PCT No.: PCT/US2007/010006
§ 371 (c)(1),
(2), (4) Date: May 20, 2010

(87) PCT Pub. No.: WO2007/145712
PCT Pub. Date: Dec. 21, 2007

(65) Prior Publication Data
US 2010/0276592 A1    Nov. 4, 2010

Related U.S. Application Data

(60) Provisional application No. 60/811,621, filed on Jun. 7, 2006.

(51) Int. Cl.
*G01N 23/00* (2006.01)
(52) U.S. Cl.
USPC .......................................................... 250/310

(58) Field of Classification Search
USPC .................. 250/310, 311, 441.11, 440.11; 324/754.22, 754.21
See application file for complete search history.

(56) References Cited

U.S. PATENT DOCUMENTS

| | | | |
|---|---|---|---|
| 3,602,686 A | 8/1971 | Lempert | |
| 3,971,546 A * | 7/1976 | Bruner | 256/14 |
| 3,981,546 A * | 9/1976 | Sperman | 384/12 |
| 4,080,526 A | 3/1978 | Kihara et al. | |
| 4,162,391 A * | 7/1979 | Sciaky | 219/121.13 |
| 4,165,881 A * | 8/1979 | Salter | 277/425 |
| 4,229,655 A | 10/1980 | Ryding | |
| 4,241,259 A | 12/1980 | Feuerbaum et al. | |
| 4,516,026 A | 5/1985 | Jouffrey et al. | |
| 4,580,619 A * | 4/1986 | Aitken | 165/46 |
| 4,584,479 A | 4/1986 | Lamattina et al. | |
| 4,607,167 A | 8/1986 | Petric | |
| 4,705,949 A | 11/1987 | Grimes, II et al. | |
| 4,818,838 A | 4/1989 | Young et al. | |
| 5,103,102 A | 4/1992 | Economou et al. | |
| 5,254,856 A | 10/1993 | Matsui et al. | |
| 5,396,067 A | 3/1995 | Suzuki et al. | |
| 5,399,860 A | 3/1995 | Miyoshi et al. | |
| 5,453,617 A | 9/1995 | Tsuneta et al. | |
| 5,591,970 A | 1/1997 | Komano et al. | |
| 5,869,833 A | 2/1999 | Richardson et al. | |
| 6,057,553 A | 5/2000 | Khursheed et al. | |
| 6,176,023 B1 | 1/2001 | Doche | |
| 6,320,194 B1 | 11/2001 | Khursheed et al. | |
| 6,421,122 B2 | 7/2002 | Nara et al. | |
| 6,515,288 B1 * | 2/2003 | Ryding et al. | 250/441.11 |
| 6,559,457 B1 | 5/2003 | Phan et al. | |
| 6,582,251 B1 * | 6/2003 | Burke et al. | 439/589 |
| 6,667,475 B1 | 12/2003 | Parran et al. | |
| 6,683,316 B2 | 1/2004 | Schamber et al. | |
| 6,710,354 B1 | 3/2004 | Koch et al. | |
| 6,768,114 B2 | 7/2004 | Takagi | |
| 6,831,278 B2 | 12/2004 | Yamamoto et al. | |
| 6,844,922 B2 | 1/2005 | Bisschops et al. | |
| 6,897,443 B2 * | 5/2005 | Gross | 850/9 |
| 6,936,817 B2 | 8/2005 | Feuerbaum | |
| 7,043,848 B2 | 5/2006 | Hollman et al. | |
| 7,060,990 B2 | 6/2006 | Tanaka et al. | |
| 7,091,497 B2 * | 8/2006 | Visscher | 250/442.11 |
| 7,211,797 B2 | 5/2007 | Nishiyama et al. | |
| 7,220,963 B2 | 5/2007 | Gross | |
| 7,220,973 B2 | 5/2007 | Yu et al. | |
| 7,230,253 B2 | 6/2007 | Ham | |

| | | | |
|---|---|---|---|
| 7,294,833 B2 | 11/2007 | Konno et al. | |
| 7,301,157 B2 | 11/2007 | Buijsse et al. | |
| 7,456,413 B2 | 11/2008 | Buijsse et al. | |
| 7,767,979 B2 | 8/2010 | Dona | |
| 2002/0024012 A1 | 2/2002 | Abe et al. | |
| 2002/0054717 A1* | 5/2002 | Zywno | 384/12 |
| 2002/0180946 A1* | 12/2002 | Bisschops et al. | 355/72 |
| 2003/0042852 A1* | 3/2003 | Chen | 313/512 |
| 2004/0232834 A1* | 11/2004 | Costello | 313/530 |
| 2004/0238739 A1* | 12/2004 | Gross | 250/310 |
| 2005/0023770 A1* | 2/2005 | Swensen et al. | 277/602 |
| 2006/0006342 A1* | 1/2006 | Hosoda et al. | 250/441.11 |
| 2006/0249917 A1* | 11/2006 | Kosty | 277/644 |
| 2006/0284108 A1* | 12/2006 | Buijsse et al. | 250/441.11 |
| 2007/0176102 A1 | 8/2007 | Slingerland et al. | |
| 2009/0200489 A1 | 8/2009 | Tappel et al. | |
| 2009/0242763 A1 | 10/2009 | Buijsse | |
| 2010/0194874 A1 | 8/2010 | Bierhoff et al. | |
| 2010/0230590 A1 | 9/2010 | Bierhoff et al. | |
| 2010/0294049 A1 | 11/2010 | Kelley et al. | |

FOREIGN PATENT DOCUMENTS

| | | | |
|---|---|---|---|
| DE | 3332248 | | 3/1985 |
| DE | 3618283 | | 12/1987 |
| EP | 0969494 | | 1/2000 |
| EP | 1622185 | | 2/2006 |
| EP | 1622185 | A1 * | 2/2006 |
| JP | 401296549 | | 11/1989 |
| JP | 03194838 | | 8/1991 |
| JP | 04363849 | | 12/1992 |
| JP | 06-139984 | | 5/1994 |
| JP | 2004-031207 | | 1/2004 |
| JP | 2004-253156 | | 9/2004 |
| JP | 2004-327302 | | 11/2004 |
| JP | 2005-147956 | | 6/2005 |
| JP | 2005-203123 | | 7/2005 |
| WO | 2007008602 | | 1/2007 |
| WO | 2007143734 | | 12/2007 |
| WO | 2007143736 | | 12/2007 |
| WO | 2007143737 | | 12/2007 |
| WO | 2007145712 | | 12/2007 |

OTHER PUBLICATIONS

Cameron, R.E. et al., "Minimizing Sample Evaporation in the Environmental Scanning Electron Microscope," Journal of Microscopy, Mar. 1994, pp. 227-237, vol. 173, Part 3.

Toth, M. et al., "On the Role of Electron-Ion Recombination in Low Vacuum Scanning Electron Microscopy," Journal of Microscopy, Jan. 2002, pp. 86-95, vol. 205, Part 1.

Mathieu, C., "The Beam-Gas and Signal-Gas Interactions in the Variable Pressure Scanning Electron Microscope," Scanning Microscopy, 1999, pp. 23-41, vol. 13, No. 1.

Wanstrand, O.,"Wear Resistant Low Friction Coatings for Machine Elements," Dissertation, Acta Universitatis Upsaliensis, Uppsala 2000, 38 Pages.

Jackson, R.L. et al., "A Statistical Model of Elasto-Plastic Asperity Contact Between Rough Surfaces," Science Direct, Tribology International, 2006, pp. 906-914, vol. 39.

Kim, N.H. et al., "Finite Element Analysis and Experiments of Metal/Metal Wear in Oscillatory Contacts," Science Direct, Wear, 2005, pp. 1787-1793, vol. 258.

Norden, B.N., "On the Compression of a Cylinder in Contact with a Plane Surface," NBSIR 73-243, Final Report, Institute for Basic Standards, National Bureau of Standards, Jul. 19, 1973, 67 Pages, Washington (D.C.).

Khursheed, A., et al., "Miniature scanning electron microscope design based upon the use of permanent magnets," Proc. SPIE 3155, Charged Particle Optics III, Sep. 27, 1997, pp. 175-184.

* cited by examiner

*Primary Examiner* — Robert Kim
*Assistant Examiner* — Jason McCormack
(74) *Attorney, Agent, or Firm* — Scheinberg & Associates, PC; Michael O. Scheinberg; Ki O

(57) ABSTRACT

An apparatus for loading a sample into a particle-optical instrument that includes a slider bearing having a base plate in contact with the vacuum chamber at one side, said base plate showing a first through-hole in contact with the vacuum chamber, and a second plate, one side of the second plate in contact with the base plate, said second plate also showing a through-hole, where the faces of the base plate and the second plate facing each other are sufficiently smooth to form a non-elastomeric vacuum seal and where the second plate is a flexible plate and the face of the flexible plate opposite to the base plate is equipped to seal against a cup equipped to hold a sample. Preferably the through-hole in the base plate shows a rim facing the flexible plate with a controlled curvature, the curvature of the rim formed such that the vacuum seal between the base plate and the flexible plate forms on a pre-defined contour and that the Hertzian contact pressure is smaller than a pre-defined maximum contact pressure, the pre-determined maximum contact pressure chosen to minimize particle generation. By forming the second plate as a flexible plate the pressure with which the base plate and the second plate are pressed together is better reproducible than when both plates are rigid. By forming the rim with a controlled radius, particle generation is minimized.

15 Claims, 3 Drawing Sheets

SLIDER BEARING FOR USE WITH AN APPARATUS COMPRISING A VACUUM CHAMBER

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A "MICROFICHE APPENDIX"

Not Applicable

NAMES OF THE PARTIES TO A JOINT RESEARCH AGREEMENT

Not Applicable

SEQUENCE LISTING ON COMPACT DISC OR PAPER

Not Applicable

BACKGROUND OF THE INVENTION

The invention relates to a slider bearing for use with an apparatus comprising a vacuum chamber, the slider bearing comprising:
- a base plate in contact with the vacuum chamber at one side, said base plate showing a first through-hole in contact with the vacuum chamber,
- a second plate, one side of the second plate in contact with the base plate, said second plate showing a second through-hole, the faces of the base plate and the second plate facing each other being sufficiently smooth to form a non-elastomeric vacuum seal,
said base plate and said second plate slidable between a first relative position in which the first through-hole and the second through-hole do not overlap and a second relative position in which the first through-hole and the second through-hole overlap. Such a slider bearing is known from European application No. 05076474, published as EP1 622 185 A1.

Such a slider bearing is used in e.g. a tabletop Scanning Electron Microscopes (tabletop SEM). A tabletop SEM is a SEM which is both much smaller and much cheaper than conventional SEM's. Such tabletop SEM's are commercially available from e.g. FEI Company under the name Phenom.

The known slider bearing comprises a base plate on which an electron-optical column is mounted. The electron-optical column produces a focused beam of electrons along an electron-optical axis. The base plate shows a through-hole in contact with the evacuated inner volume of the electron-optical column, centred round the electron-optical axis. The base plate is placed against a second plate in such a way that the first and the second plate may slide over each other and that a vacuum seal is formed between the two plates, thereby sealing the evacuated inner volume of the electron-optical column. The second plate shows a depression in which a sample is placed.

To insert the sample in the depression the plates are positioned such that the through-hole in the base plate is covered by the second plate (thus sealing the evacuated inner volume of the electron-optical column), and the depression is open to atmosphere (thus enabling entrance from outside). To observe the sample the depression is aligned with the through-hole in the base plate by sliding the two plates over each other. Sliding the two plates over each other also performs fine alignment of an area of interest on the sample with respect to the electron-optical axis.

As known to the person skilled in the art vibrations are a major limitation for the resolution obtained with particle-optical instruments. The known slider bearing uses a metal-to-metal seal, without using an elastomer in the form of e.g. an O-ring. An advantage of a slidable seal not using elastomers is that it results in a very stiff coupling of the electron-optical column to the sample, and thus a low sensitivity to vibration. Therefore a non-elastomeric seals is preferred over the more commonly used elastomer seals, such as O-ring seals.

In the known slider bearing the force with which the two plates are pressed together depends on the area enclosed by the contour of the vacuum seal. At the interface between the base plate and the second plate the area within the contour can be thought to be evacuated, the area outside the contour to be connected to atmosphere. The force with which the two plates are pressed together is thus the evacuated area enclosed by the contour multiplied with the atmospheric pressure. To slide the two plates over each other, the (static) friction force between the two plates must be overcome, said static friction force dependent on the force with which the two plates are pressed together.

A disadvantage of the known slider bearing is that the contour where the vacuum seal is formed is not well defined: e.g. a slight curvature or unevenness of one of the two plates may change the contour where the actual seal forms. As a result the force with which the two plates are pressed together is likely to vary with the position of the plates relative to each other. This in turn results in a varying frictional force between the two plates when sliding them over each other, and thus a different loading of the actuators that slide the two plates over each other. This change in load of the drive is contrary to the demands of a high precision and/or low backlash drive. It also necessitates the use of a drive that is more powerful than needed, resulting in a larger and a more expensive drive for the slider bearing.

Another disadvantage of the known slider bearing is that during sliding particles may be produced at those places where the pressure occurring locally is too high. These particles can be introduced in the electron-optical column of the tabletop SEM, where they can give rise to e.g. charging. They can also be introduced on the sample, and be mistaken for parts of the sample, thereby giving false information about the sample.

The invention aims to provide a slider bearing that does not show these disadvantages.

BRIEF SUMMARY OF THE INVENTION

The invention relates to an apparatus for loading a sample into a particle-optical instrument that includes a slider bearing having a base plate in contact with the vacuum chamber at one side, said base plate showing a first through-hole in contact with the vacuum chamber, and a second plate, one side of the second plate in contact with the base plate, said second plate also showing a through-hole, where the faces of the base plate and the second plate facing each other are sufficiently smooth to form a non-elastomeric vacuum seal and where the second plate is a flexible plate and the face of the flexible plate opposite to the base plate is equipped to seal against a cup equipped to hold a sample. Preferably the through-hole in the base plate shows a rim facing the flexible plate with a controlled curvature, the curvature of the rim formed such that the vacuum seal between the base plate and the flexible plate forms on a pre-defined contour and that the Hertzian contact pressure is smaller than a pre-defined maximum contact pressure, the pre-determined maximum contact pressure chosen to minimise particle generation. By forming the second plate as a flexible plate the pressure with which the base plate and the second plate are pressed together is better reproducible than when both plates are rigid. By forming the rim with a controlled radius, particle generation is minimized.

BRIEF DESCRIPTION OF THE SEVERAL VIEWS OF THE DRAWINGS

The invention will be elucidated on the basis of figure, whereby identical reference numerals indicate corresponding elements. To that end.

DETAILED DESCRIPTION OF THE INVENTION

Figure 1:
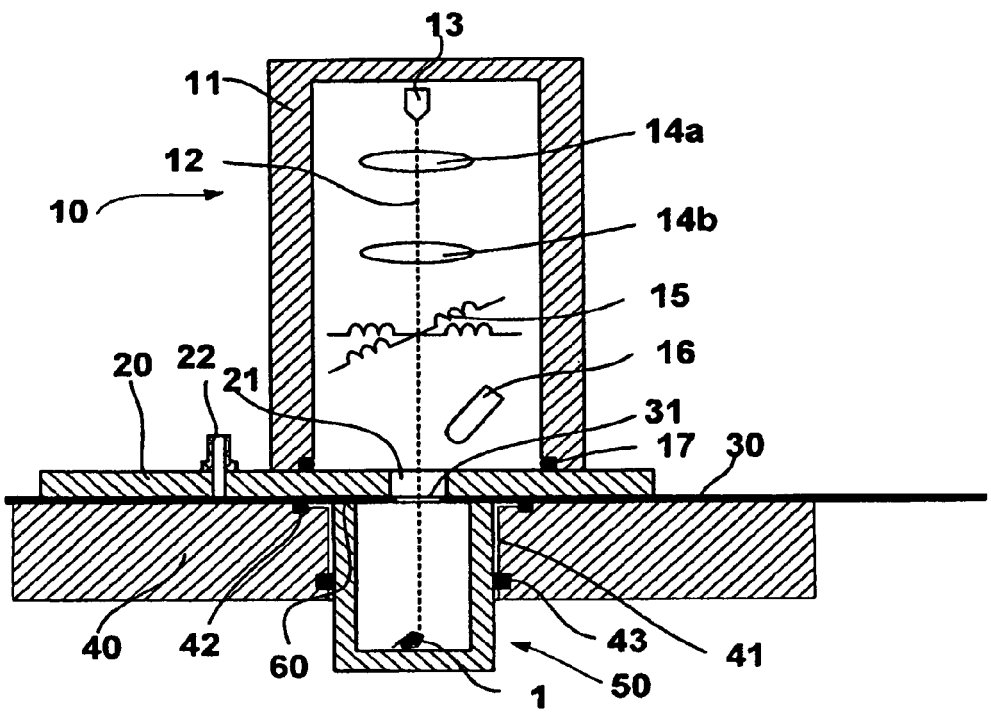
FIG. 1 schematically depicts an apparatus comprising a slider bearing according to the invention, FIG. 2A schematically depicts the slider bearing in a position where the through-hole in the base plate connecting to the particle-optical column is sealed by the flexible plate FIG. 2B schematically depicts the slider bearing in a position where the through-hole in the base plate connecting to the particle-optical column partly overlaps with the through-hole in the flexible plate, FIG. 2C schematically depicts the slider bearing in a position where the through-hole in the base plate connecting to the particle-optical column is substantially centred with respect to the through-hole in the flexible plate, FIG. 3A schematically shows a detail of FIG. 2A, showing the vacuum seal, FIG. 3B schematically shows a detail of FIG. 3A.

To that end the slider bearing according to the invention is characterised in that:
the second plate is a flexible plate,
the face of the flexible plate opposite to the base plate is equipped to seal against a cup, the cup equipped to hold a sample,
the first through-hole in the base plate shows a rim facing the flexible plate with a controlled curvature, the curvature of the rim formed such that the vacuum seal between the base plate and the flexible plate forms on a pre-defined contour and that the Hertzian contact pressure is smaller than a pre-defined maximum contact pressure, the pre-determined maximum contact pressure chosen to minimise particle generation.

By making the second plate a flexible plate it will follow any curvatures of the base plate. When the flexible plate closes the first through-hole, the flexible plate is sucked into the through-hole due to the atmospheric pressure at one side of the flexible plate and the vacuum in the through-hole. As a result a seal is formed at the rim of the first through-hole, so that the contour where the vacuum seal forms is well-defined. The plates are therefore pressed together with a well-defined force.

By controlling the curvature the contact area is controlled and, given the elasticity of the materials of the base plate and the flexible plate, the maximum contact pressure—the Hertzian pressure—can be determined. This maximum contact pressure can be determined by analytical modelling, but also e.g. modelling together with finite element analysis can be used to determine the maximum pressure occurring. A paper describing both approaches for a simple model is "Finite element analysis and experiments of metal/metal wear in oscillatory contacts", Nam Ho Kim et al., Wear 258 (2005), pages 1787-1793.

In the article "On the compression of a cylinder in contact with a plane surface", B. Nelson Norden, NBSIR 73-243, Institute for Basic Standards, National Bureau of Standards, Washington (D.C.), USA, Jul. 19, 1973, several models are compared for a cylinder placed between to flat planes. Especially at pages 42 and 43 of this report the person skilled in the art finds a relation between the Hertzian pressure and the radius of the cylinder for given materials and loading for the situation where only normal loading occurs, so without frictional force.

By choosing the curvature and the material constants such that this pressure is below a pre-determined value, generation of particles due to wear is strongly reduced or totally avoided. This pre-determined value can be deduced empirically or from e.g. the maximum yield strength of the materials of the plates.

It is remarked that surface roughness must be taken into account when determining the maximum pressure. A model for this, starting with the maximum pressure found using the Hertzian model, is given in "A statistical model of elasto-plastic asperity contact between rough surfaces", R. L. Jackson et al., Tribology International 39 (2006), pages 906-914.

It is further remarked that the before mentioned formulae refer to a normal loading of the two surfaces. Experiments show that by using the vector summation of normal force and friction force (the two forces being perpendicular to each other) as the force applied to the surfaces a good approximation is obtained in the case where friction occurs.

In an embodiment the predetermined maximum pressure is less than the maximum yield strength derived from the Von Mises yield criterion or the Tresca's maximum shear stress criterion.

As known to the person skilled in the art a criterion for determining whether particles are pulled from the surface of an interface between two materials is (a fraction of) e.g. the Von Mises yield criterion of the softer of the two plates. Therefore the Von Mises yield criterion can be used to determine said pre-determined value. More details can be found in e.g. "Wear resistant low friction coatings for machine elements", O. Wänstrand, dissertation, Acta Universitatis Upsaliensis, Uppsala 2000, especially chapter 4.4.1. Alternatively (a fraction of) the Tresca's maximum shear stress criterion of the softer of the two plates can be used.

In another embodiment of the slider bearing according to the invention the flexible plate is pressed against the base plate by one or more resilient members.

The atmospheric pressure pushes the flexible plate to the base plate at those positions where a vacuum is presented by the base plate, e.g. by the through-hole in the base plate. At other positions the flexible plate could sag. By pressing the flexible plate against the base plate with one or more resilient members the flexible plate will follow the surface of the base plate also at those areas where no vacuum pressure presses the two together. This results in a defined shape of the flexible plate, as no sagging or such will occur. This in turn assures that the contour where the two plates form a seal is well defined.

The resilient members may be springs, but may also take the form of e.g. a plate made of resilient material such as resilient foam.

In still another embodiment of the slider bearing according to the invention at least one of the plates show a surface layer with a composition different from the bulk of the plate, the friction coefficient between said surface layer and the other plate being less than the friction coefficient between the bulk material of said plate and the other plate.

By giving at least one of the plates a surface layer for lowering the friction coefficient between the plates, less force is needed to slide the two plates over each other, compared to the situation where such an impregnation is not present. The surface layer can be e.g. a ceramic surface layer, but can also be an impregnation or coating comprising e.g. tungsten diselenium ($WSe_2$) and/or iodine ($I_2$).

In yet another embodiment of the slider bearing according to the invention at least one of the plates shows a surface layer comprising copper.

By using a copper alloy, such as bronze of brass for one of the plates and e.g. steel for the other plate a slider bearing with low friction is formed.

In still another embodiment of the slider bearing according to the invention at least one of the plates show a surface layer comprising a fluoropolymer.

By using a surface layer comprising a fluoropolymer, such as PTFE (polytetrafluoroethylene), PFA (perfluoroalkoxy polymer resin), FEP (fluorinated ethylene-propylene) and the like, the slider bearing shows a low friction coefficient.

In a further embodiment of the slider bearing according to the invention the fluoropolymer is PTFE.

In this preferred embodiment at least one of the plates is impregnated with PTFE (polytetrafluoroethylene). This material is well known to show a low friction coefficient when sliding over a wide range of materials, such as polished steel.

In an embodiment of the slider bearing according to the invention at least one of the plates is covered by or impregnated with a substance comprising a metal disulphide.

In a further embodiment of the slider bearing according to the invention at least one of the plates is covered by or impregnated with a substance comprising a metal disulphide from the group of $MoS_2$, $WS_2$, and $SeS_2$.

In an embodiment of the slider bearing according to the invention at least one of the plates is covered with or impregnated by a grease or an oil.

By using a lubricant in the form of an oil or a grease, the friction between the two plates is lowered. The grease or oil used can be an organic oil or grease, but also a synthetic and/or a fluorinated oil or grease. Especially certain fluorinated oils and greases are known to be compatible with vacuum.

In an embodiment of the invention an apparatus comprises a slider bearing according to the invention, the apparatus comprising the vacuum chamber.

In an embodiment of the apparatus according to the invention the vacuum chamber is part of a particle-optical column.

In a further embodiment of the apparatus according to the invention the particle-optical column produces a focused beam of ions and/or electrons.

In a yet further embodiment of the apparatus according to the invention the apparatus takes the form of a Scanning Electron Microscope (SEM).

FIG. 1 schematically depicts an apparatus comprising a slider bearing according to the invention.

A particle-optical column 10 is mounted on a base plate 20 of the slider bearing. The particle-optical column comprises a vacuum chamber 11, which is evacuated by vacuum means (not shown), such as a vacuum pump. The vacuum chamber is sealed on the base plate 20 of the slider bearing with a vacuum seal 17. The vacuum chamber encloses a particle source 13, producing a beam of particles, such as ions or electrons, round an axis 12. The beam of particles is manipulated by e.g. lenses (14a, 14b) and deflectors (15). As known to the person skilled in the art particle-optical lenses and deflectors may be magnetic, but also electric lenses and/or deflectors may be used. The beam of particles is focused by the lenses 14a, 14b onto a sample 1, and is scanned over an area of interest by the deflectors 15. The sample is thus irradiated by the particle beam, and in response to the irradiation (place dependent) information in the form of e.g. secondary electrons, backscattered electrons or X-rays emanate from the sample. This information is detected by a detector 16, which is placed in the vacuum chamber. The signal of this detector can be used to form an image of the sample.

The base plate 20 of the slider bearing shows a through-hole 21. In the position shown through-hole 21 is connected to the evacuated particle-optical column 10. The base plate 20 is placed on a flexible plate 30. The flexible plate 30 shows a through-hole 31. The flexible plate is supported by a support plate 40. The flexible plate is, together with support plate 40, slidable over the base plate: that is: support plate 40 and flexible plate 30 are moved together with respect to the base plate. The support plate shows a through-hole 41 in which a cup 50 can be placed. The support plate shows two seals, seal 42 and seal 43, that seal the interior of cup 50 from atmosphere. The cup contains the sample 1.

The base plate shows two through-holes: through-hole 21 and through-hole 22. Through-hole 21 connects to the vacuum chamber of the particle-optical column, and when overlapping with through-hole 31 in the flexible plate (as is the case in the situation of FIG. 1) enables that the interior of cup 50 is kept evacuated and that the particle beam can irradiate the sample. When through-hole 31 in the flexible plate and through-hole 21 in the base plate do not overlap, a vacuum seal is formed between the flexible plate and the base plate, so that the vacuum chamber 11 of the particle-optical column is isolated from air.

Through-hole 22 is used to pre-evacuate or vent the cup when the base plate and the flexible plate are positioned such that through-hole 22 and through-hole 31 in the flexible plate overlap. Pre-evacuation is advantageous in those situations where the vacuum in vacuum chamber 11 must be kept at a minimum value: if the cup would be connected to through-hole 21 while the cup is still at atmospheric pressure, a pressure burst would occur in the vacuum chamber.

Cup 50 is pressed to the flexible plate 30 by the atmospheric pressure at a circular contour 60. As a result the flexible plate is pushed against the base plate and a vacuum seal is formed between the flexible plate and the base plate.

FIG. 2 depicts the slider bearing in different positions of the flexible plate and the base plate relative to each other.

Figure 2A:
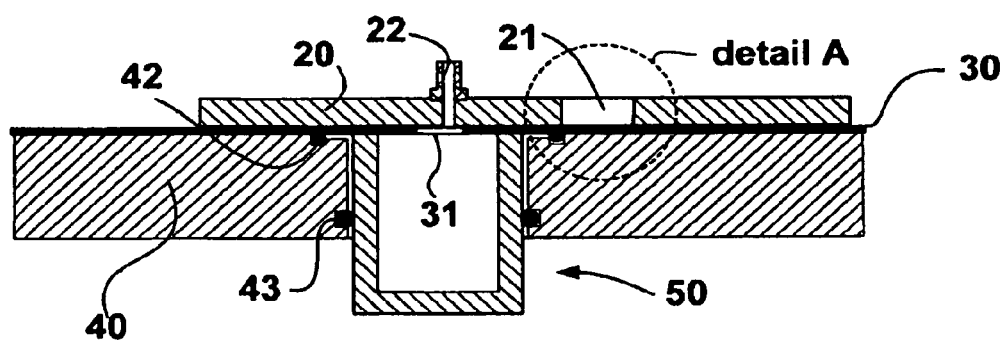

FIG. 2A schematically depicts the slider bearing in a position where the through-hole in the base plate connecting to the particle-optical column is sealed by the flexible plate.

Though-hole 21 in base plate 20 is closed off by the flexible plate. Around the rim of the through-hole 21 the flexible plate is bend inwards, due to the atmospheric pressure at one side of the flexible plate (at the side of the supporting plate 40) while the other side of the flexible plate is connected to the evacuated through-hole 21 in the base plate. As a result a vacuum seal between the flexible plate and the base plate is formed at the rim of the through-hole in the base plate.

In this position of the slider bearing the inside of cup 50 is connected to through-hole 22, which may connect to a pre-vacuum pump to evacuate the cup. Alternatively the through-hole 22 can be used to vent the cup to e.g. air.

Figure 2B:
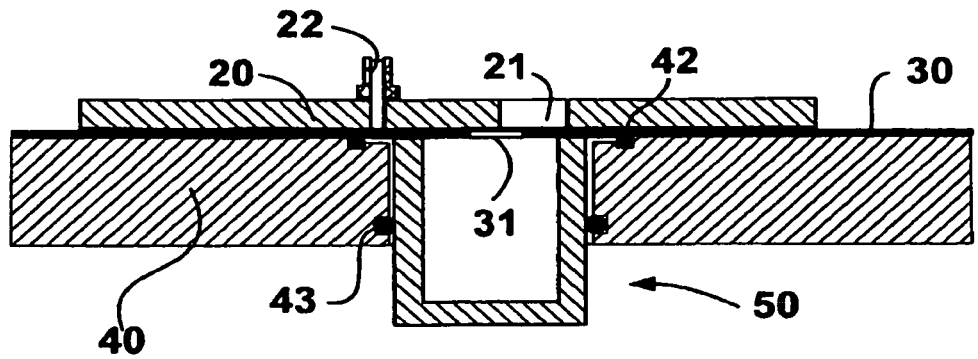

FIG. 2B schematically depicts the slider bearing in a position where the through-hole in the base plate connecting to the particle-optical column partly overlaps with the through-hole in the flexible plate.

Figure 2C:
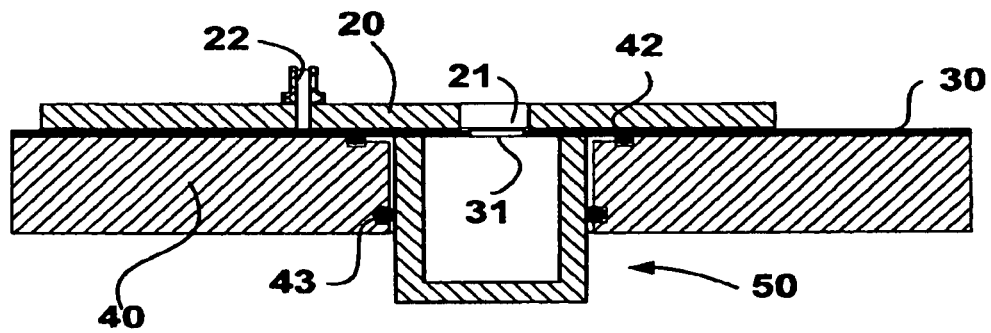

FIG. 2C schematically depicts the slider bearing in a position where the through-hole in the base plate connecting to the particle-optical column is substantially centred with respect to the through-hole in the flexible plate.

Figure 3A:
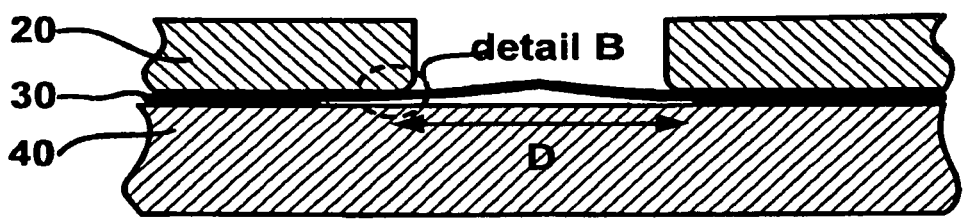
FIG. 3C shows a preferred embodiment, where the through-hole takes the form of a hole with a lip.

FIG. 3A schematically shows a detail of FIG. 2A, showing the vacuum seal.

Flexible plate 30 is sucked into the through-hole 21 in base plate 20 because a vacuum is present at the side of the through-hole 21 in base plate 20 and atmospheric pressure is present at the opposite side of the flexible plate 30. Assuming a circular shape of through-hole 20, a circular seal is formed with diameter D.

The force along the contour equals the surface of the area surrounded by the contour multiplied by the atmospheric pressure, for a circular contour thus $$F = P\frac{\pi}{4}D^2 \quad [1]$$

with F the force along the contour, P the atmospheric pressure, and D the diameter of the contour.

To avoid particle generation it is well-known that the maximum contact pressure or yield pressure must be below the Von Mises yield criterion or the Tresca's maximum shear stress criterion for the softer of the two materials.

Figure 3B:
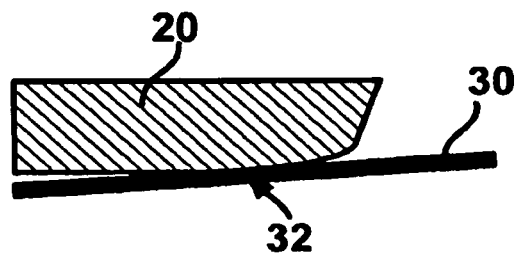

FIG. 3B schematically show a detail of FIG. 3A.

FIG. 3B shows the form of the edge of through-hole 21 in the base plate 20. The flexible plate contacts the base plate round contour 32. For given materials it can thus be determined, at a given force along the contour, what the size of the contact zone should be to have no or little particle generation. The size of the contact zone can be realized by giving the contour 32 of the through-hole 21 in the base plate a minimum radius, said radius resulting in a sufficiently large size of the contact zone. The size of the contact zone can be derived from the Hertzian model of a cylinder with length L equal to the circumference of the contour (L=π×D) and loading F (see formula [1]), or by modelling it and using finite element analysis to determine the size of the contact zone.

Experiments show that by using for the loading force $$F_{tot} = \sqrt{F_n^2 + F_f^2} \quad [2]$$

with $F_n$ the normal loading force as derived in formula [1] and $F_f$ the friction force, a good approximation is obtained in the case where friction occurs. As the friction force can be written as $F_f = \mu \times F_n$, with μ the coefficient of friction, this can also be written as:

$$F_{tot} = F_n\sqrt{1+\mu^2} \quad [3]$$

Combining formula [1] and [3] results in $$F_{tot} = P \times \frac{\pi D^2}{4} \times \sqrt{1+\mu^2} \quad [4]$$

By using this force $F_{tot}$ in the formulae of the article of Nelson Norden, a maximum pressure can be obtained as a function of the radius of the edge of through-hole 21. By choosing the radius of the edge at the place where the flexible plate seals on the base plate sufficiently large that the resulting pressure is well below the maximum yield strength (derived from the Von Mises yield criterion or the Tresca's maximum shear stress criterion), no or almost no particles are generated.

It is remarked that most of the formulae cited in Nelson Norden are applicable for a cylinder against a flat surface. As can be seen in FIG. 3B, in reality the situation is better approximated by a cylinder (the rim of the through-hole in the base plate) against which the flexible plate rest, the latter thus showing a cylinder with a negative radius. An improvement in the analytical approach is therefore to use more general formulae for cylinder-to-cylinder contacts, with one cylinder (the base plate) showing positive radius and the second cylinder (the flexible plate) showing a negative radius.

It is further remarked that, as mentioned before, surface roughness must be taken into account when determining the maximum pressure. A model for this, starting with the maximum pressure found using the Hertzian model, is given in "A statistical model of elasto-plastic asperity contact between rough surfaces", R. L. Jackson et al., Tribology International 39 (2006), pages 906-914.

Figure 3C:
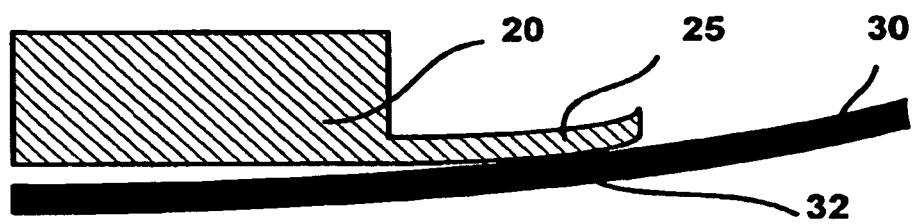

FIG. 3C shows a preferred embodiment, where the through-hole takes the form of a through-hole with a lip.

The proper choice of the rim of the through-hole and of the materials is determined by many factors, each of them showing certain advantages and disadvantages. However, for each of them the maximum pressure can be determined and thereby the curvature of the rim can be derived. Also the flexibility of the flexible plate 30 has to be taken into account, as this determines the position of the contour as well. When using a through-hole 21 with a diameter of e.g. 2.5 centimeters, the radius to be used for the rim is often in excess of 1 meter. A preferred method of forming a through-hole 21 with such a rim is by machining the through-hole with a lip 25 (the contour where the vacuum seal forms positioned on the lip) and then plastically deforming the lip into the required form with a rubber pad. By controlling the thickness of the lip and the compression of the rubber pad, a good control of the radius of the rim 25 is realized.

The preceding paragraphs give a recipe to determine the radius of the contour, for given materials of the two surfaces. An important factor in making the choice of the materials is the friction coefficient between the two plates, as this not only is a factor in the determination of said radius, but even more important determines the maximum force that is needed to let the two slide over each other. A combination showing a low friction coefficient is a polished flexible plate of steel combined with a base plate showing a surface comprising a fluoropolymer such as PTFE. The entire base plate can be made of such a polymer, or it can be e.g. a polished metal plate coated by or impregnated with PTFE.

It is remarked that coating or impregnating a material, such as bronze, with a coating layer, such as PTFE, results in an overall elasticity modulus in between the elasticity modulus of each of the two materials. This is also known for ceramic surface layers on e.g. steel.

In a preferred embodiment a steel flexible plate is combined with a base plate showing a bronze surface coating, in which the bronze surface coating is impregnated with a fluoropolymer comprising PTFE.

Figure 4:
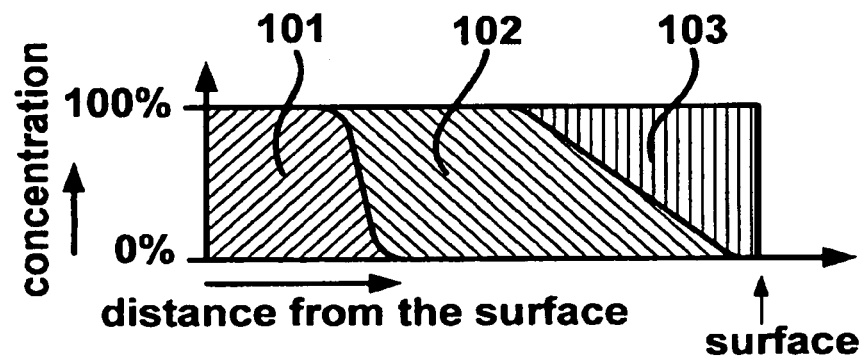
FIG. 4 schematically show the composition as a function of the depth in the material of a plate of the slider bearing with a surface layer

FIG. 4 schematically shows the composition of such a base plate: the bulk 101 of the base plate is steel, with a layer 102 of bronze on its surface. This layer is porous, its porosity increasing when going to the surface. Impregnating this bronze layer with a fluoropolymer 103 thus results in an increase of the amount of the fluoropolymer near the surface, resulting in a pure or almost pure layer of the polymer 103 at the surface.

Other combination of a steel flexible plate and a bronze base plate with e.g. a layer of molybdenum disulphide also proved to work well, although much care must be taken to form the metal disulphide layer in such a way that no particles flake from the surface.

Also combinations of steel and an organic lubricant work well, but are not preferred for work with a particle-optical column, as the grease and/or oil can migrate to particle-optical elements of the column and cause e.g. charging when exposed to the particle beam.

The invention claimed is:

1. Slider bearing for use with an apparatus comprising a vacuum chamber, the slider bearing comprising:
    a base plate in contact with the vacuum chamber at one side, said base plate showing a first through-hole in contact with the vacuum chamber;
    a second plate, one side of the second plate in contact with the base plate, said second plate showing a second through-hole;
    the faces of the base plate and the second plate facing each other being sufficiently smooth to form a non-elastomeric vacuum seal;
    said base plate and said second plate slidable between a first relative position in which the first through-hole and the second through-hole do not overlap and a second relative position in which the first through-hole and the second through-hole overlap; and
    in which the second plate is a flexible plate,
    the face of the flexible plate opposite to the base plate is equipped to seal against a cup, the cup equipped to hold a sample, and
    the first through-hole in the base plate having a rim, the rim having a radius that is smaller than the radius of second through-hole, the rim has a curvature that is bent upwards away from the second plate, the curvature of the rim formed such that the vacuum seal between the base plate and the flexible plate forms on a pre-defined contour and that the Hertzian contact pressure is smaller than a pre-determined maximum contact pressure, the pre-determined maximum contact pressure chosen to minimise particle generation.

2. The slider bearing according to claim 1 in which the pre-determined maximum contact pressure is less than the maximum yield strength derived from the Von Mises yield criterion or the Tresca's maximum shear stress criterion.

3. The slider bearing according to claim 1 in which the flexible plate is pressed against the base plate by one or more resilient members.

4. The slider bearing according to claim 1 in which at least one of the plates shows a surface layer with a composition different from the bulk of the plate, the friction coefficient between said surface layer and the other plate being less than the friction coefficient between the bulk material of said plate and the other plate.

5. The slider bearing according to claim 1 in which at least one of the plates shows a surface layer comprising copper.

6. The slider bearing according to claim 1 in which at least one of the plates shows a surface layer comprising a fluoropolymer.

7. The slider bearing according to claim 6 in which the fluoropolymer is PTFE.

8. The slider bearing according to claim 1 in which at least one of the plates is covered by or impregnated with a substance comprising a metal disulphide.

9. The slider bearing according to claim 8 in which the metal disulphide is a metal disulphide from the group MoS2, WS2 and SeS2.

10. The slider bearing according to claim 1 in which at least one of the plates is covered with or impregnated by a grease or an oil.

11. An apparatus comprising a slider bearing according to claim 1, said apparatus comprising the vacuum chamber.

12. The apparatus according to claim 11 in which the vacuum chamber is part of a particle-optical column.

13. The apparatus according to claim 12 in which the particle-optical column produces a focused beam of ions or electrons.

14. The apparatus according to claim 13 in which the apparatus comprises a Scanning Electron Microscope (SEM).

15. A slider bearing for use with an apparatus having a vacuum chamber, the slider bearing comprising:
    a base plate in contact with the vacuum chamber at one side, said base plate showing a first through-hole in contact with the vacuum chamber;
    a flexible plate, one side of the flexible plate in contact with the base plate, said flexible plate showing a second through-hole;
    the faces of the base plate and the flexible plate facing each other being sufficiently smooth to form a non-elastomeric vacuum seal;
    said base plate and said flexible plate slidable between a first relative position in which the first through-hole and the second through-hole do not overlap and a second relative position in which the first through-hole and the second through-hole overlap;
    the face of the flexible plate opposite to the base plate equipped to seal against a cup, the cup equipped to hold a sample; and
    the first through-hole in the base plate having a rim, the rim having a radius that is smaller than the radius of second through-hole, the rim has a curvature that is bent upwards away from the flexible plate, the curvature of the rim formed such that the vacuum seal between the base plate and the flexible plate forms on a pre-defined contour and such that the Hertzian contact pressure is smaller than a pre-defined maximum contact pressure, the pre-determined maximum contact pressure chosen to minimize particle generation.

* * * * *